US006784526B1

(12) United States Patent
Mezawa

(10) Patent No.: US 6,784,526 B1
(45) Date of Patent: Aug. 31, 2004

(54) INTEGRATED CIRCUIT DEVICE MODULE

(75) Inventor: Tsutomu Mezawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/120,117

(22) Filed: Jul. 22, 1998

(30) Foreign Application Priority Data

Jan. 19, 1998 (JP) .......................................... 10-007771

(51) Int. Cl.$^7$ .......................... H01L 29/40; H01L 23/34; H01L 23/52; H05K 7/10; H07B 1/00
(52) U.S. Cl. ...................... 257/679; 257/775; 257/723; 257/678; 257/784; 257/685; 257/531; 257/692; 361/760; 361/777; 361/788; 361/767; 361/768; 361/737; 361/784; 361/101; 361/102
(58) Field of Search ................................. 257/679, 692, 257/775, 723, 678, 784, 685, 531; 361/760, 777, 788, 767–768, 737, 784, 101–102, 803, 783; 710/301–302, 118, 307, 309–313; 333/12, 32–34; 365/51, 52, 63

(56) References Cited

U.S. PATENT DOCUMENTS 4,021,838 A * 5/1977 Warwick .................... 257/777
5,513,135 A * 4/1996 Dell et al. .................... 365/52
5,914,873 A * 6/1999 Blish, II ...................... 363/147
6,040,621 A * 3/2000 Nose .......................... 257/666
6,215,076 B1 * 4/2001 Inagawa et al. ............ 174/261
6,366,466 B1 * 4/2002 Leddige et al. ............. 361/760

FOREIGN PATENT DOCUMENTS

| JP | 4-221830 | 8/1992 |
| JP | 08055956 A | 2/1996 |

* cited by examiner

Primary Examiner—David L. Talbott
Assistant Examiner—James Mitchell
(74) Attorney, Agent, or Firm—Arent Fox Kintner Plotkin & Kahn, PLLC

(57) ABSTRACT

According to the present invention, for a module in which a plurality of integrated circuit devices are mounted in parallel, the inductance generated by the unit length of a branched signal line on a motherboard is so set that it is smaller for a branched signal line a longer distance from its branching point to its distal end, and is so set that it is larger for a branched signal line having a shorter distance from its branching point to its distal end, so that the time required for transmission of a signal from the branching point to the distal end of each branched signal line is the same.

7 Claims, 13 Drawing Sheets

FIRST EMBODIMENT

FIG. 6

SIGNAL TRANSMISSION PERIOD TO WIDTHS
FOR BRANCHED SIGNAL LINES

| Width of branched signal line | Cd PF/m | Co PF/m | Lo nH/m | Zo Ω | Td ns/m | Td1 ns/m |
|---|---|---|---|---|---|---|
| 0.05 mm | 250 | 71 | 520 | 85.6 | 6.08 | 12.92 |
| 0.10 mm | 250 | 82 | 450 | 74.1 | 6.07 | 12.22 |
| 0.20 mm | 250 | 109 | 356 | 57.1 | 6.23 | 11.31 |
| 0.40 mm | 250 | 159 | 263 | 40.7 | 6.47 | 10.37 |
| 0.80 mm | 250 | 252 | 173 | 26.2 | 6.60 | 9.32 |

SECOND EMBODIMENT

EQUIVALENT CIRCUIT FOR SIGNAL LINES

INTEGRATED CIRCUIT DEVICE MODULE

BACKGROUND OF THE INVENTION

1. Field of the Invention

The present invention relates to an integrated circuit device module on which a plurality of integrated circuit devices, such as memories, are mounted, and in particular to an innovative structure for preventing ringing on a signal line along which a signal is supplied in parallel to a plurality of integrated circuit devices.

2. Related Arts

Integrated circuit modules, such as semiconductor memory modules having large structures and a plurality of integrated circuit devices mounted on a single board, are frequently mounted on motherboards. With such an integrated circuit module, an address signal, a control signal and a common signal, such as a clock, are supplied along branched signal lines to the integrated circuit devices mounted on the board.

FIG. 1 is a plan view of an example semiconductor memory module showing part of the signal lines. A driver device 12 and nine semiconductor memory devices 14 to 30 are mounted on the surface of a motherboard 10. Although not shown, nine other semiconductor memory devices are also mounted on the reverse face of the motherboard 10. An external card-edge terminal 32 of the motherboard 10 is inserted into a connector on a main motherboard, not shown.

An address signal, for example, originates at an output terminal N1 of the memory driver 12 and is supplied, along a common signal line 36 and along branch signal lines 38 and 40 on the obverse surface and branch signal lines 42 and 44 on the reverse surface which are connected at a node N3 with the signal line 36, to four groups of the 18 memory devices 14 to 30. A dumping resistor R1 is provided between the output terminal N1 and the terminal N2 of the common signal line 36. Input terminals corresponding to the memory devices are connected to the branch signal lines 38, 40, 42 and 44, which branch out in four directions at the node N3.

In the example shown in FIG. 1, a plurality of integrated circuit devices 14 to 30, such as memory devices, are longitudinally mounted on the motherboard 10. Nine other integrated circuit devices are mounted on the reverse face of the motherboard 10 at corresponding positions. Therefore, the driver device 12 is mounted longitudinally in the center portion, and a signal from the driver device 12 is transmitted along a signal supply line 36 and to a branch node N3, both of which are provided longitudinally in the center, and then to branched signal lines 38, 40, 42 and 44 which extend vertically in the longitudinal direction. With this arrangement, a signal is supplied to all the memory devices as symmetrically as possible.

The dumping resistor R1 is provided while taking into account the reflection of signals at the farthest terminals N4, N5, N6 and N7 of the branched signal lines 38, 40, 42 and 44. Specifically, the amplitude of a full-swing signal at the output terminal N1 of the driver device 12 is reduced by half through the provision of the dumping resistor R1, and reflected signals are superimposed on each other at the terminals N4 to N7 for the branched signal lines 38 to 44. Finally, the potential of the branched signal lines becomes a full-swing potential. That is, the signal passes through the output terminal N1, the node N2 and the branch node N3 and along the branched signal lines 38 to 44. The signals are reflected at the terminals N4 to N7 on the branched signal lines, and the reflected signals are returned via the respective branched signal lines to the node N3.

However, as is apparent from FIG. 1, the lengths of the branched signal lines 38 to 44 are not always equal. This is because, since the mounting direction for the integrated circuit devices 14 to 30, such as memory devices, on the motherboard 10 is the same, the positional relationship between their corresponding external terminals is reversed at upper and lower locations on the motherboard, as is shown in FIG. 1. As a result, on the obverse surface of the motherboard 10, for example, the distance from the node N3 to the terminal N4 is not the same as the distance from the node N3 to the terminal N5, and thus there is a time lag (a skew) between signals reaching integrated circuit devices positioned at their edges. A signal which reaches an edge is reflected, and the reflected signal is transmitted to the opposite terminal N4 or N5. Therefore, it has been found that, since a skewed reflected signal is superimposed on an original signal, and reflected signals having a phase difference interfere with each other, a vibrating waveform called ringing occurs.

FIG. 2 is a graph showing a signal waveform for a simulation at the nodes N1 to N5 of the module in FIG. 1. FIG. 3 is a graph showing a signal waveform when the first 4 nsec period in FIG. 2 is enlarged along the time axis. As is shown by the signal waveform in FIG. 2, a pulse signal having an amplitude of 3 V rises and falls within a short time period at the output terminal N1 of the device driver 12. At the node N2, due to the dumping resistor R1, the inclination of the rise of a signal is ½.

Because of the existence of a dumping resistor R2, a signal at the node N2 rises to an amplitude of 1.5 V at an inclination which is half that for the rise of the signal at the output terminal N1. Since the module in FIG. 1 is so designed that the rising time is shorter than the reciprocal transmission time for a supplied signal, the potential at the node N2 is temporarily maintained at 1.5 V. Then, when the signal reflected at the node N4 or N5 is superimposed on the original signal, the potential at the node N2 is raised to 3 V. Similarly, a signal at the output terminal N1 falls at 3 V, whereas a signal at the node N2 first falls to 1.5 V, due to the dumping resistor R1, and then to 0 V, due to the superimposing of the signals reflected at the nodes N4 and N5.

Since the distance between the branch node N3 and the node N4 is shorter than the distance between the branch node N3 and the node N5, first a signal at the node N4 rises, and then, after being slightly skewed, a signal at the node N5 rises. Since the signal reflected at the node N4 or N5 is superimposed on the original signal, the resultant signal does not have a step shaped waveform, as is shown for the node N2, and substantially rises and falls at the same inclination as that for the output terminal N1.

However, since the reflected signals interfere with each other due to skewing of signals at the nodes N4 and N5, ringing in the signals at the nodes N4 and N5 occurs, as is shown in the graphs. Such ringing causes the vibration of signals input to the memory devices 30 (I) and 14 (A) at the nodes N4 and N5, respectively, and also causes an erroneous operation to be performed.

Such input signal vibration occurs not only with address signals, but also with control signals and clock signals which are supplied in common by the driver device 12. In other words, for a module on which a plurality of logic devices are mounted, the same vibration problem occurs with a control signal and a clock signal which are used in common.

SUMMARY OF THE INVENTION

To resolve the above problem, it is one objective of the present invention to provide an integrated circuit device module for eliminating vibration, which accompanies a difference in the lengths of branched signal lines, of signals which are input to integrated circuit devices located at the distal ends of branched signal lines.

It is another objective of the present invention to provide an integrated circuit device module which resolves a problem concerning interference occurring between reflected signals at the distal ends of branched signal lines.

It is an additional objective of the present invention to provide an integrated circuit device module wherein signal skewing at the distal ends of branched signal lines is eliminated.

It is a further objective of the present invention to provide an integrated circuit device module wherein signal interference which occurs at branched signal lines is eliminated.

To achieve the above objectives, according to the present invention, for a module in which a plurality of integrated circuit devices are mounted in parallel, the inductance generated by the unit length of a branched signal line on a motherboard is so set that it is smaller for a branched signal line having a longer distance from its branching point to its distal end, and is so set that it is larger for a branched signal line having a shorter distance from its branching point to its distal end, so that the time required for transmission of a signal from the branching point to the distal end of each branched signal line is the same.

To view the above in a different way, a branched signal line, on the motherboard, having a longer distance from its branching point to its distal end has a smaller characteristic impedance than a shorter branched signal line, so that the time required for transmission of a signal from the branching point to the distal end of each branched signal line is the same.

More specifically, the width of a longer branched signal line is larger than that of a shorter branched signal line. As a result, the inductance generated by the unit length of the longer signal line is smaller than the inductance generated by the unit length of the shorter signal line. If the width of a signal line is simply increased, its inductance is reduced, and at the same time the total capacity of branched signal lines formed opposite a power wiring layer, such as a ground wiring layer, is increased. However, the terminals of a plurality of integrated circuit devices whereof the terminal capacity is greater than the signal line capacity are also connected to the branched signal lines. Therefore, even though the signal line capacity is increased, the ratio of the increase to the overall capacity, including the terminal capacity, is not too great. As a result, when the width of a longer branched signal line is increased, the inductance can be reduced and the time required for the transmission of signal along the branched signal line can be reduced. Of course, instead of this, a shorter branched signal line may be narrowed.

According to another structure, a smaller area opposite a power wiring layer for a shorter signal line is provided, such as a ground wiring layer, and a larger area opposite a power wiring layer is provided for a longer signal line. More specifically, a power wiring layer opposite a shorter branched signal line is so formed that its portions are intermittently removed, and a power wiring layer opposite a longer branched signal line is continuously formed.

With this structure, the inductance generated by the unit length of a shorter branched signal line is increased. As a result, the time required for the transmission of a signal along the shorter signal line is increased. Since a signal transmission delay time for a longer branched signal line equals the signal transmission time for a shorter branched signal line, the interference due to the reflected signals can be prevented. As a result, the conventional problem involving the vibration of signals at the distal ends can be resolved.

According to an additional structure, one part of a shorter branched signal line is formed of a material containing a ferromagnetic substance. For example, a shorter branched signal line may be so formed for which a copper thin film is selectively plated with a ferromagnetic material, such as Ni. The inductance generated by the shorter branched signal line is increased by the deposition of the ferromagnetic material.

According to a further structure, the distal ends of branched signal lines are connected together. Specifically, the distal ends of branched signal lines formed on the obverse surface and on the reverse surface of the motherboard are connected together to form a loop, so that signal lines which are separate at the branch point have the same length. As a result, signals transmitted along signal lines on the same loop do not interfere with each other, and the conventional ringing problem due to interference can be eliminated.

According to one aspect of the present invention, an integrated circuit device module, in which a plurality of groups of integrated circuit devices are mounted on a motherboard, comprises:

a plurality of branched signal lines, formed on the motherboard and extending from a common branch node to individual distal ends, along which a common signal is supplied to the groups of integrated circuit devices respectively, wherein each of the plurality of branched signal lines comprises a first branched signal line having a first length from the branch node to the distal end, and a second branched signal line having a length from the branch node to the distal end which is shorter than the first length, and an inductance generated by the unit length of the first branched signal line is smaller than an inductance generated by the unit length of the second branched signal line.

According to another aspect of the present invention, an integrated circuit device module, in which a plurality of groups of integrated circuit devices are mounted on a motherboard, comprises:

a plurality of branched signal lines, formed on the motherboard and extending from a common branch node to individual distal ends, along which a common signal is supplied to the groups of integrated circuit devices respectively, wherein each of the plurality of branched signal lines comprises a first branched signal line having a first length from the branch node to the distal end, and a second branched signal line having a length from the branch node to the distal end which is shorter than the first length, and distal ends of the first and the second branched signal line are connected together to form a signal line loop.

BRIEF DESCRIPTION OF THE DRAWINGS

FIG. 6 is a table showing signal transmission times relative to the widths of the branched signal lines;

DETAILED DESCRIPTION OF THE PREFERRED EMBODIMENTS

The preferred embodiments of the present invention will now be described while referring to the accompanying drawings. It should be noted, however, that the technical scope of the present invention is not limited to these embodiments.

First Embodiment

Figure 1:
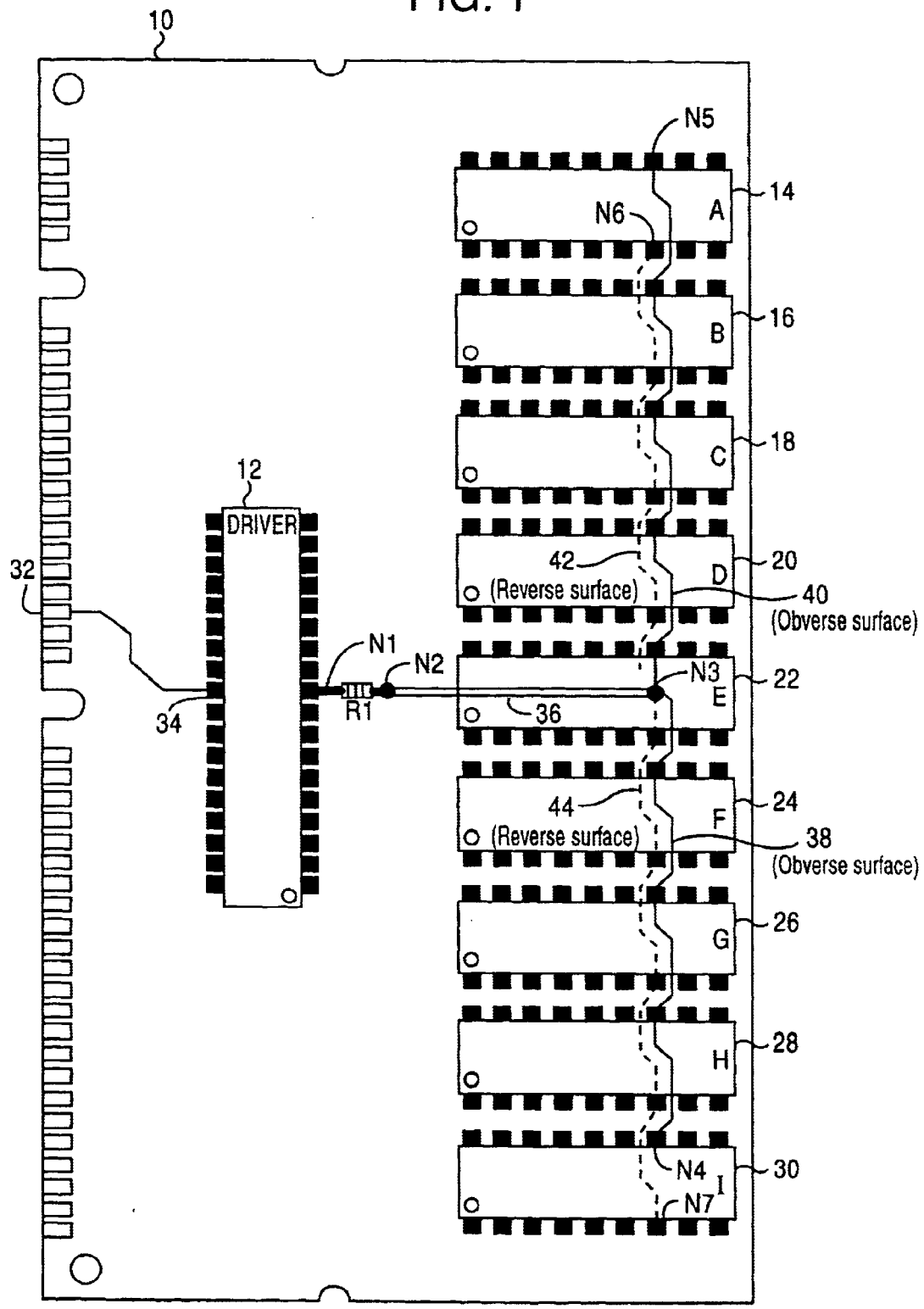
FIG. 1 is a plan view of a semiconductor memory module showing part of the signal lines.
Figure 4:
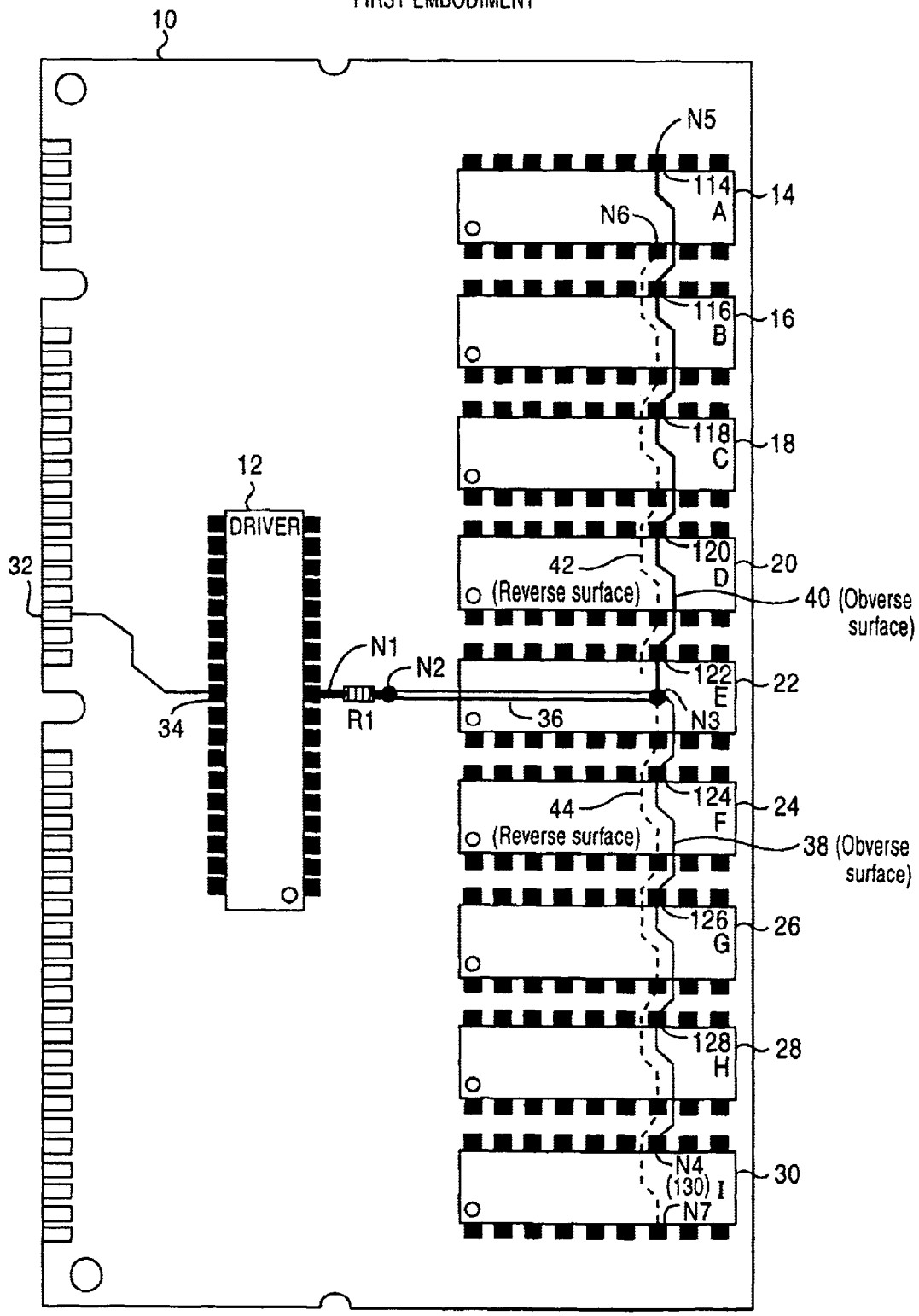
FIG. 4 is a plan view of an integrated circuit device module according to a first embodiment of the present invention.

FIG. 4 is a plan view of an integrated circuit device module according to a first embodiment of the present invention. The same reference numerals as are used in FIG. 1 are also used herein to denote identical components. In this embodiment, a branched signal line 40, which is formed on the obverse surface of a motherboard 10 for a module and for which there is a longer distance from a node N3 to a distal end N5, has a width greater than a branched signal line 38, which is formed on the obverse surface of the mother board 10 and for which there is a shorter distance from the node N3 to the distal end N4, so that an inductance $L_0$ produced by the unit length of the signal line 40 is smaller. Similarly, a branched signal line 42 (broken line), which is formed on the reverse face of the motherboard 10 and for which is a longer distance from the node N3 to a distal end N6, has a width greater than a branched signal line 44 (also a broken line), which is formed on the reverse face of the motherboard 10 and for which is a shorter distance from the node N3 to a distal end N7, so that an inductance $L_0$ produced by the unit of length of the signal line 44 is smaller.

Figure 5:
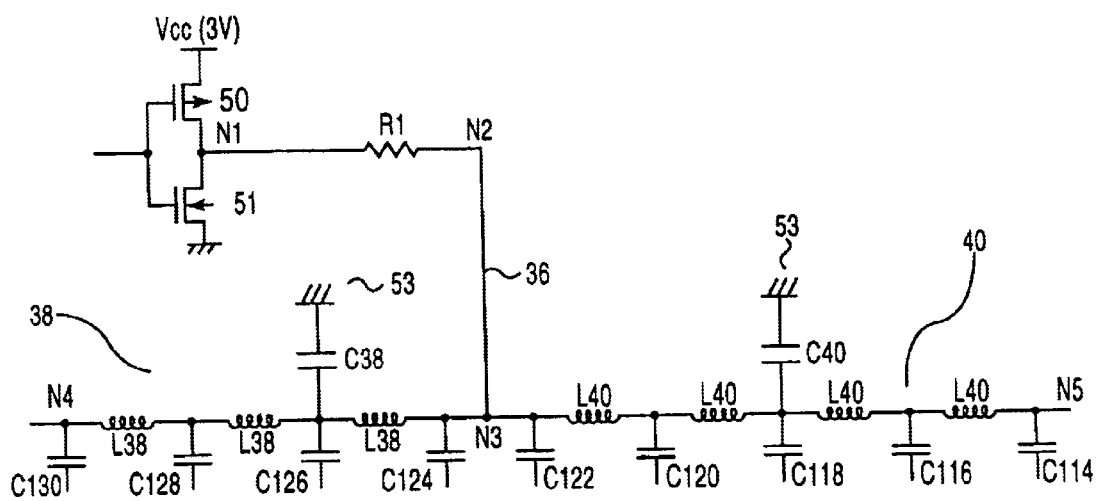
FIG. 5 is a diagram showing an equivalent circuit for branched signal lines on the motherboard in FIG. 4.

FIG. 5 is an equivalent circuit diagram for the branched signal lines on the motherboard 10 in FIG. 4. In FIG. 5, the branched signal lines 38 and 40 on the obverse surface of the motherboard 10 are shown as examples. An output terminal N1 for a driver device 12 is driven by a CMOS inverter constituted, for example, by transistors 50 and 51. A dumping resistor R1 is connected in series with the output terminal N1 and a node N2. A common signal line 36, lying between the nodes N2 and the branch node N3, is separated into the signal lines 38 and 40 at the branch node N3. The distal nodes of the branched signal lines 38 and 40 are N4 and N5, respectively. The branched signal lines 38 and 40, which have respective inductances $L_{38}$ and $L_{40}$, are provided with signal line capacitors $C_{38}$ and $C_{40}$, which are formed between the branched signal lines 38, 40 and a shielding ground wiring layer (power wiring layer) formed on the motherboard 10 (not shown here). Further, as is shown in FIG. 4, the branched signal line 38 is connected to input terminals 124, 126, 128 and 130 of integrated circuit devices 24, 26, 28 and 30, respectively, and to terminal capacitors $C_{124}$, $C_{126}$, $C_{128}$ and $C_{130}$. Similarly, the branched signal line 40 is connected to input terminals 114, 116, 118, 120 and 122 of integrated circuit devices 14, 16, 18, 20 and 22, respectively, and to terminal capacitors $C_{114}$, $C_{116}$, $C_{118}$, $C_{120}$ and $C_{122}$.

When the branched signal line 40 having a longer distance from the branch node N3 to the distal node N5 is wider than the shorter branched signal line 38, the inductance $L_{40}$ at the branched signal line 40 can be reduced.

As is shown in FIG. 5, the transmission time Td along the signal line is represented by:

$$Td = \sqrt{L_0(C_0+C_d)} \quad (1)$$

The characteristic impedance $Z_0$ for the signal line is represented by:

$$Z_0 = \sqrt{\frac{L_0}{C_0+Cd}} \quad (2)$$

wherein $L_0$ denotes an inductance of a signal line, $C_0$ denotes a capacitance $C_{38}$ or $C_{40}$ for a signal line, and Cd denotes a capacitance for a connected input terminal ($C_{124}+C_{126}+C_{128}+C_{130}$, or $C_{114}+C_{116}+C_{118}+C_{120}+C_{122}$).

As is shown in FIG. 4, the inductance $L_0$ relative to a high frequency signal is reduced by increasing the width of the branched signal line 40. In the opposite fashion, the capacitance $C_0$ between the signal line 40 and the ground wiring layer on the motherboard 10 is increased. It should be noted, however, that as is described in equation (1), the capacitance element for the signal transmission time Td has the terminal capacitance Cd in addition to the signal line capacitance $C_0$. Since the terminal capacitance Cd is normally greater than the signal line capacitance $C_0$, the rate of the increase in the capacitance element of the signal transmission time Td is not very large when the inductance $L_0$ is reduced by increasing the width of the branched signal line 40. Therefore, when the width of the branched signal line 40 in the embodiment is increased, the time Td required for signal transmission from the branch node N3 to the distal end N5 of the branched signal line 40 can be reduced so that it is the same as the time required for the branched signal line 38.

FIG. 6 is a table showing signal transmission periods relative to individual widths for the branched signal lines. In this table are shown examples where the dielectric constant of an insulating film formed between the ground wiring layer 53 and the branched signal lines of the motherboard 10 is $4.4 \times 10^{-11}$ F/m, the film thickness is 0.2 mm, and the branched signal lines 38 and 40 are formed of, for example, copper wiring which is 60 $\mu$m thick. In the table are shown the terminal capacitance Cd, the signal line capacitance $C_0$, the inductance $L_0$, the characteristic impedance $Z_0$ (see FIG. 5), the signal transmission time Td when the terminal capacitance Cd is not taken into consideration, and the signal transmission time Td1 when the terminal capacitance Cd is taken into consideration. These values are based on the unit length.

In the table in FIG. 6 are shown the above values when the widths for the branched signal line are 0.05 mm, 0.10 mm, 0.20 mm, 0.40 mm and 0.80 mm. As is apparent from the table, as the width of the branched signal line is increased, the inductance $L_0$ is reduced, so that the signal transmission time Td1 can be shortened when the terminal capacitance is taken into consideration.

In the example in this table, 0.10 mm is selected as the width of the branched signal line 38 which is approximately 52 mm long, and 0.40 mm is selected as the width of the branched signal line 40 which is approximately 61 mm long. As a result, their signal transmission times Td1 generated by the unit lengths are 12.22 ns/m and 10.37 ns/m. It is therefore found that the periods required for signal transmission along the branched signal lines 38 and 40 are substantially same:

$$52 \text{ mm} \times 12.22 \text{ ns/m} = 0.635 \text{ ns}$$

and $$61 \text{ mm} \times 10.37 \text{ ns/m} = 0.633 \text{ ns}.$$

Figure 7:
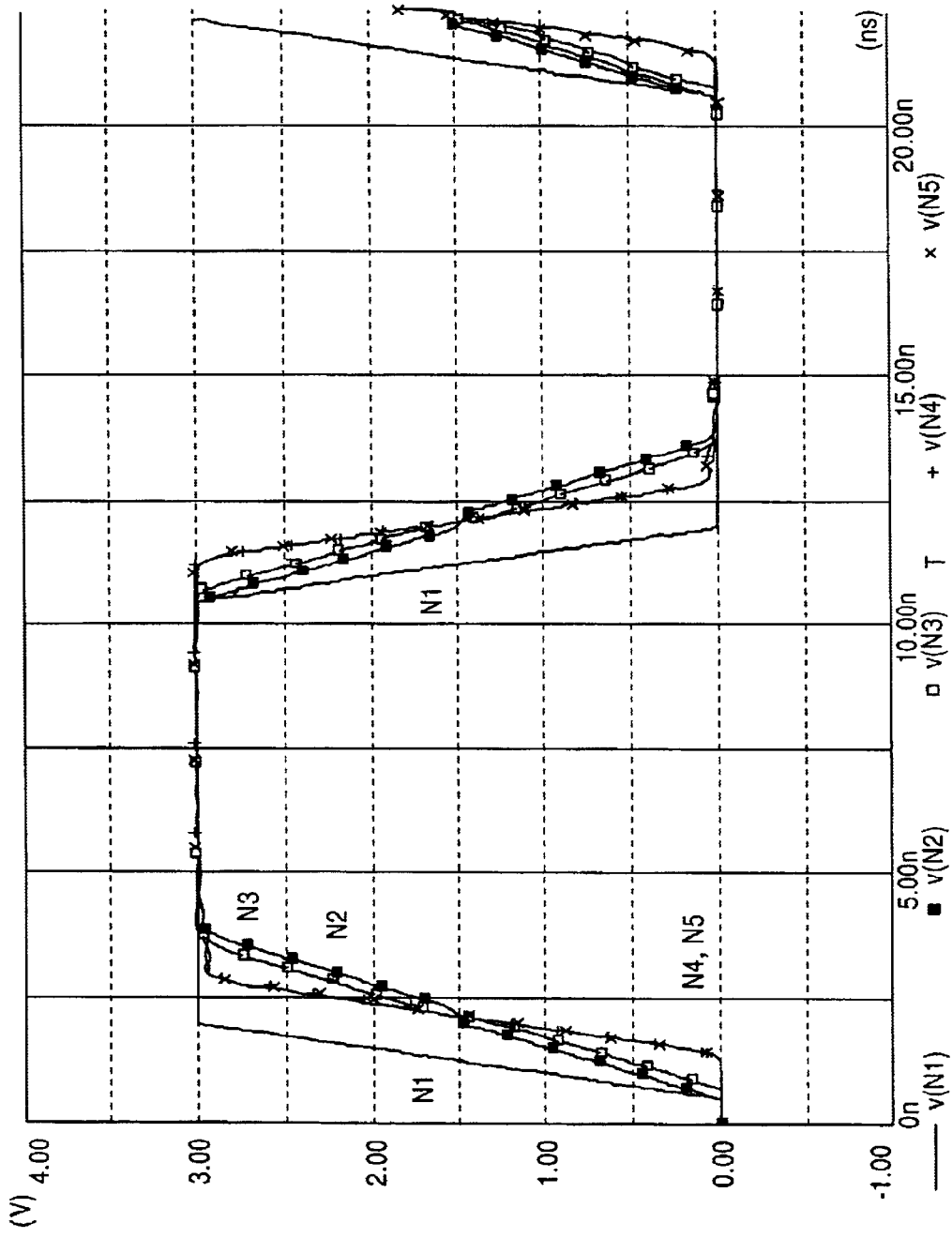
FIG. 7 is a graph showing signal waveforms at individual nodes according to the first embodiment.
Figure 8:
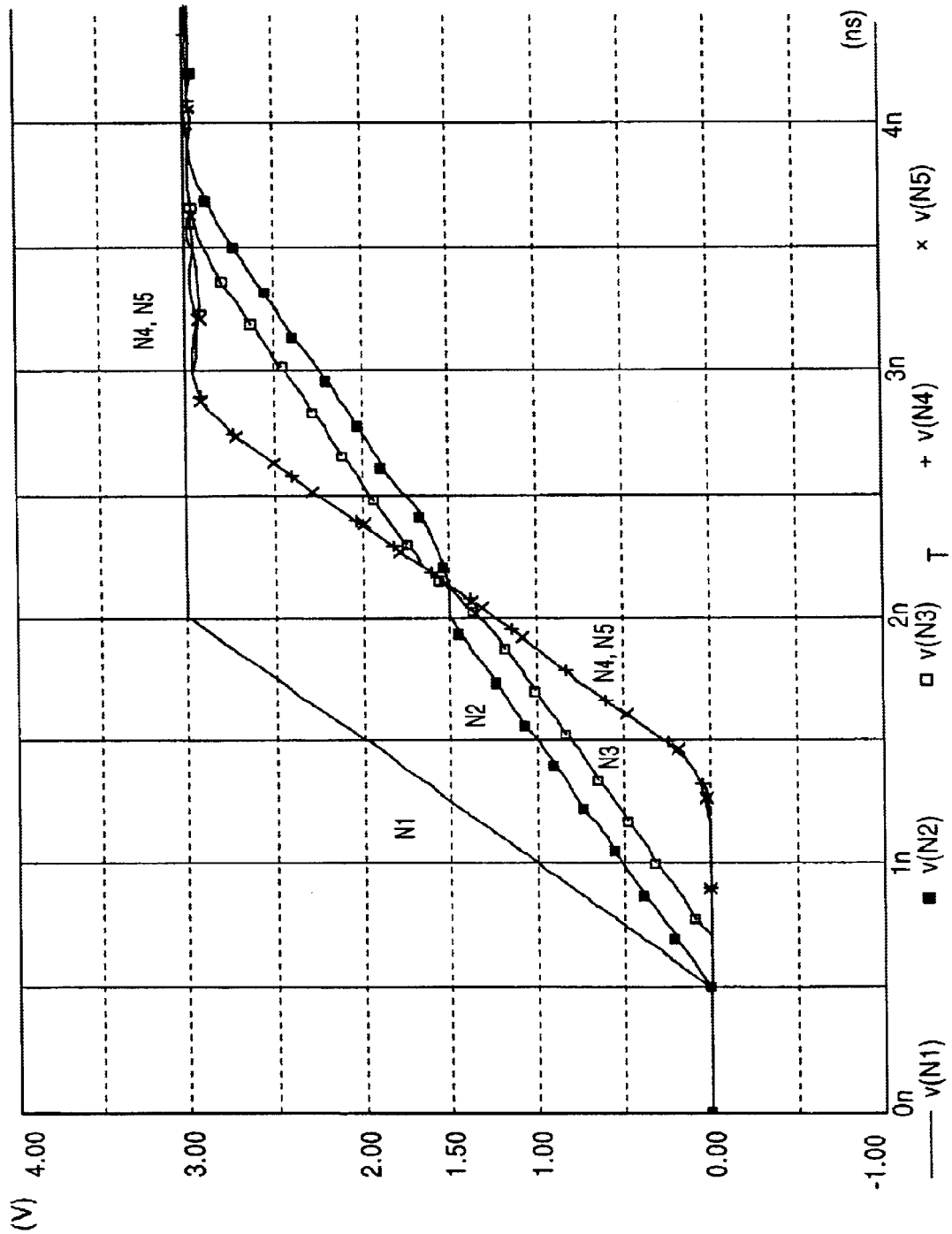
FIG. 8 is a graph showing a signal waveform in which the portion of the first rising time of 4 nesc in FIG. 7 is enlarged along the time axis.

FIG. 7 is a graph showing signal waveforms for the individual nodes of the module, according to the first embodiment, which employs the above widths for the branched signal lines. FIG. 7 corresponds to FIG. 2 for the conventional signal waveform graph. FIG. 8 is a graph showing signal waveforms in which the portion of the first rising period of 4 nesc is enlarged along the time axis.

Figure 2:
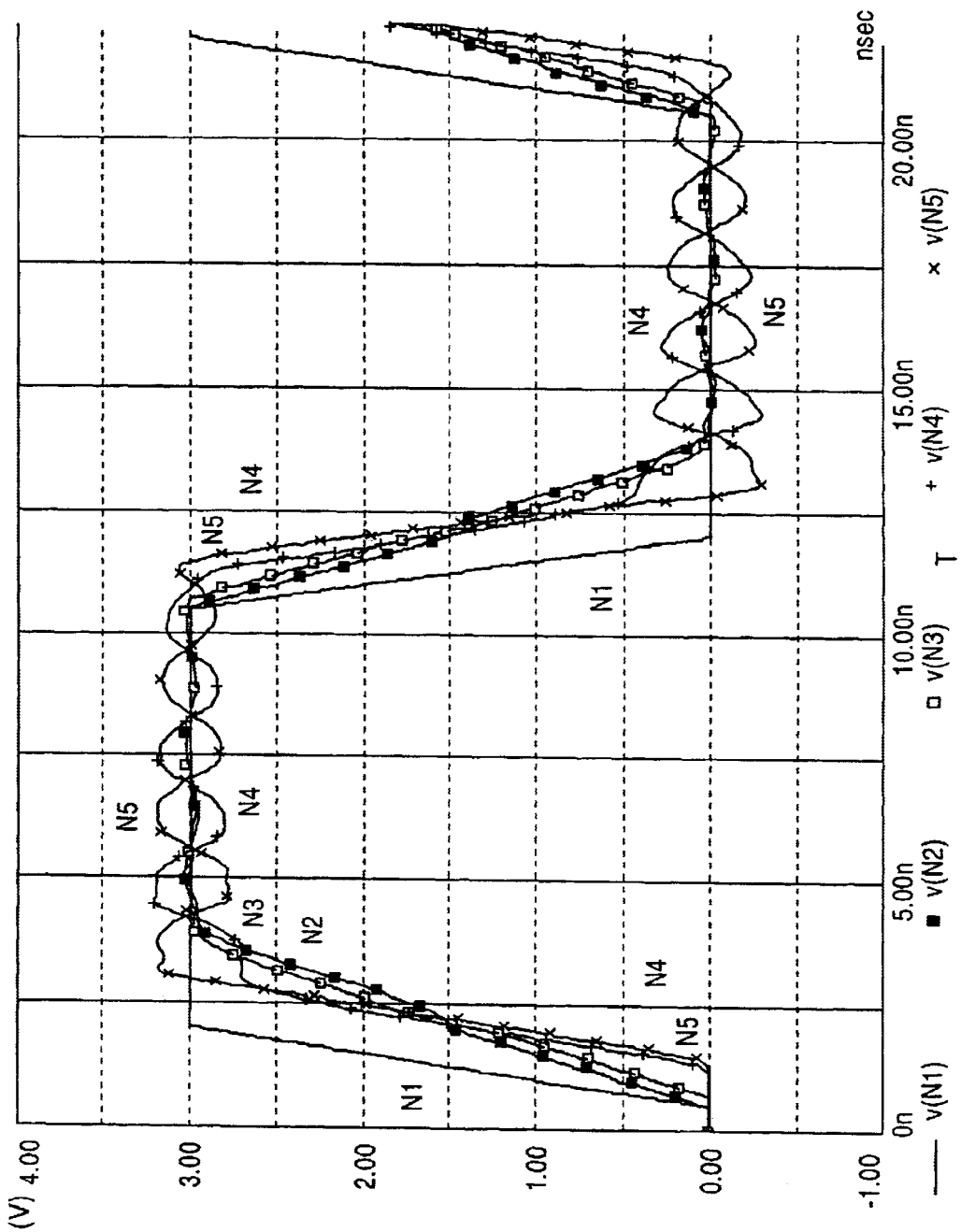
FIG. 2 is a graph showing a signal waveform for a simulation at nodes N1 to N5 in the module described in FIG. 1.
Figure 3:
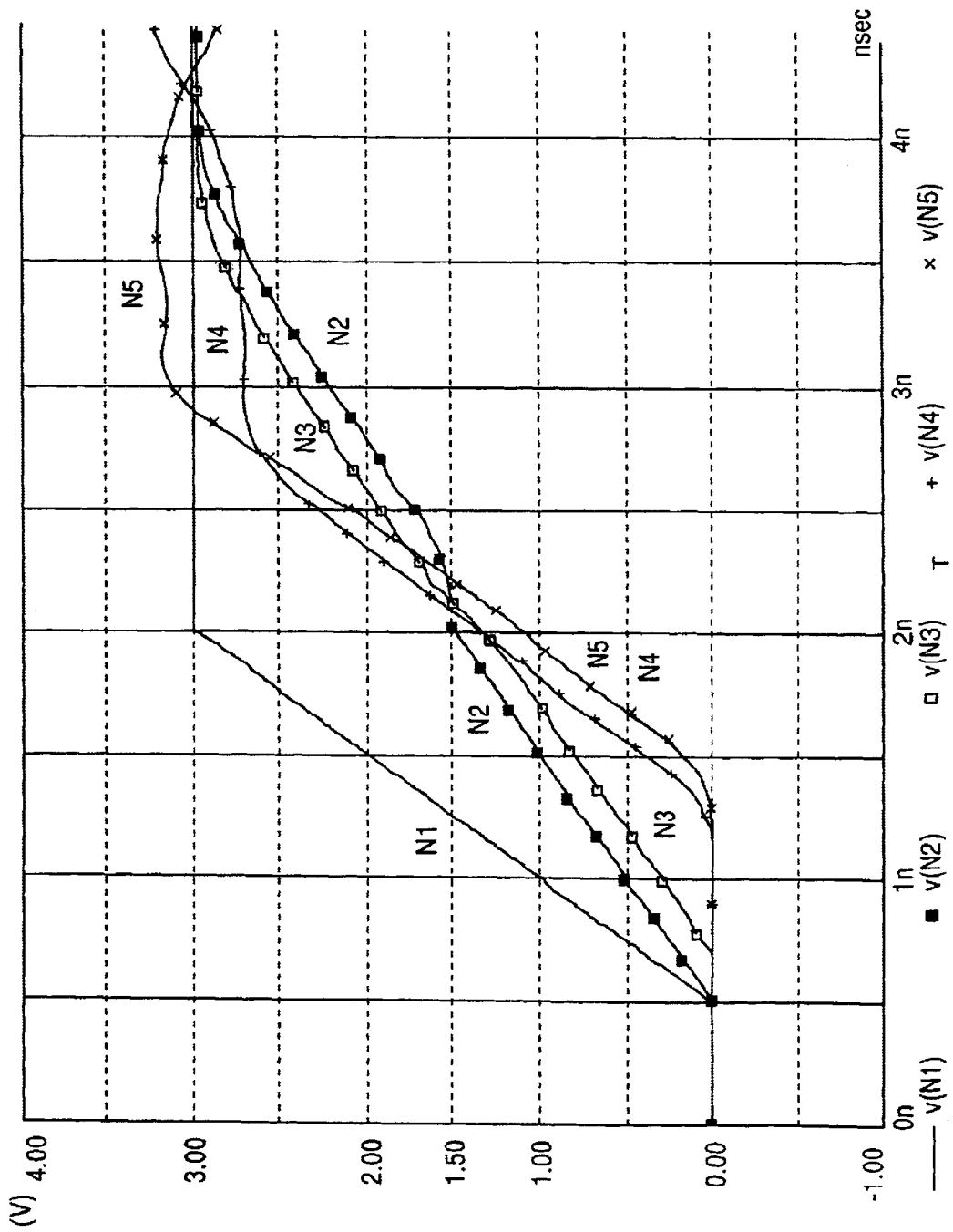
FIG. 3 is a graph showing a signal waveform in which the portion of the first period of 4 nsec is enlarged along the time axis.

As is apparent from the comparison of FIGS. 7 and 8 with FIGS. 2 and 3 for the prior art, in the first embodiment the branched signal line 40 for which there is a longer distance to the distal end node N5 is wider, and thus its inductance $L_0$ is reduced, so that the periods required for signal transmission along the branched signal lines 38 and 40 are the same. As a result, the signal waveforms at the nodes N4 and N5 match, and the skewing of the signals in the prior art is eliminated. Accordingly, the vibrating waveform due to the ringing at the nodes N4 and N5 is also eliminated. The voltages of signals at the nodes N3, N4 and N5 reach 1.5 V, which is half of the amplitude of 3 V, at substantially the same time. That is, at substantially the same time a leading signal and a trailing signal reach 1.5 V at the input terminals 114 to 130 of the integrated circuit devices 14 to 30. This means that a signal which has a voltage near a threshold value of an input circuit can be supplied to the nine integrated circuit devices 14 to 30 at substantially the same time.

As is shown in FIG. 8, similar to the prior art in FIG. 2, the voltage at the node N2 is temporarily maintained at 1.5 V due to the dumping resistor R1, and is then raised to 3.0 V due to the reflected signal.

Second Embodiment

Figure 9:
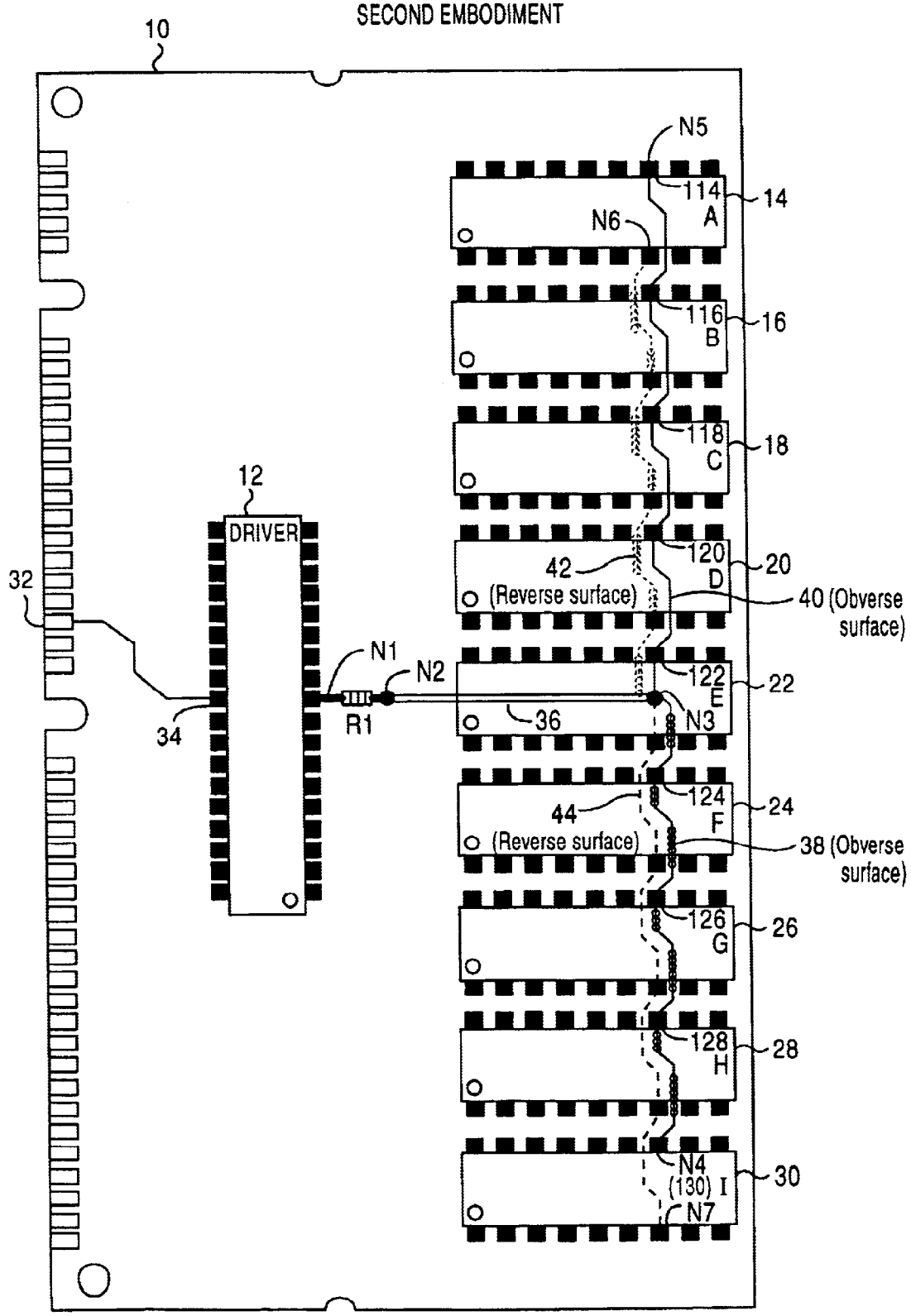
FIG. 9 is a plan view of an integrated circuit device module according to a second embodiment.

FIG. 9 is a plan view of an integrated circuit device module according to a second embodiment. In FIG. 9, the same reference numerals as are used in FIGS. 1 and 4 are used to denote corresponding components. In the second embodiment, a ground wiring layer 53 (not shown) is so formed on a motherboard 10 for a module in which slit shaped areas opposite shorter branched signal lines 38 and 42 are removed. Therefore, the size of the ground wiring layer 53 opposite the shorter branched signal lines 38 and 42 is smaller than that opposite the longer branched signal lines 40 and 44, and the inductance $L_0$ produced by the unit lengths of the shorter branched signal lines 38 and 42 can be greater by the unit length. In FIG. 9, the portions of sequentially arranged circles along the shorter branched signal lines 38 and 42 are slits formed in the ground wiring layer 53.

Figure 10:
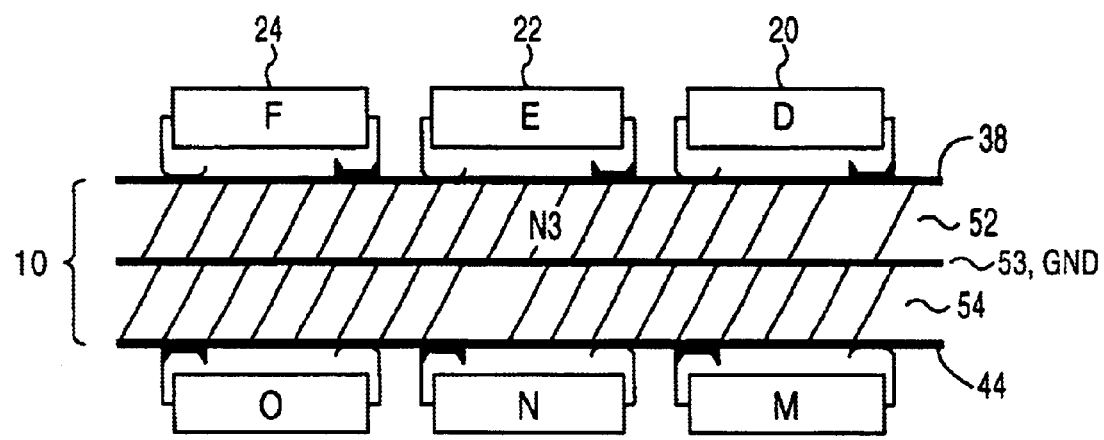
FIG. 10 is a cross-sectional view of a motherboard of a general module.

FIG. 10 is a cross-sectional view of a motherboard 10 for the general module. For the motherboard 10, a ground wiring layer 53 is formed between insulating layers 52 and 54, and a branched signal line 38 is formed on the surface of the insulating layer 52 while a branched signal line 44 is formed on the surface of the insulating layer 54 (the reverse face of the motherboard 10). The branched signal lines 38 and 44 are connected to the terminals of integrated circuits 20, 22 and 24.

The ground wiring layer 53 is normally deposited across the entire surface lying between the insulating films 52 and 54 to provide a shielding effect between the branched signal lines, and, together with the branched signal lines, substantially forms a strip line. As a result, a signal line structure can be provided wherein is obtained impedance matching for a high frequency signal.

Figure 11:
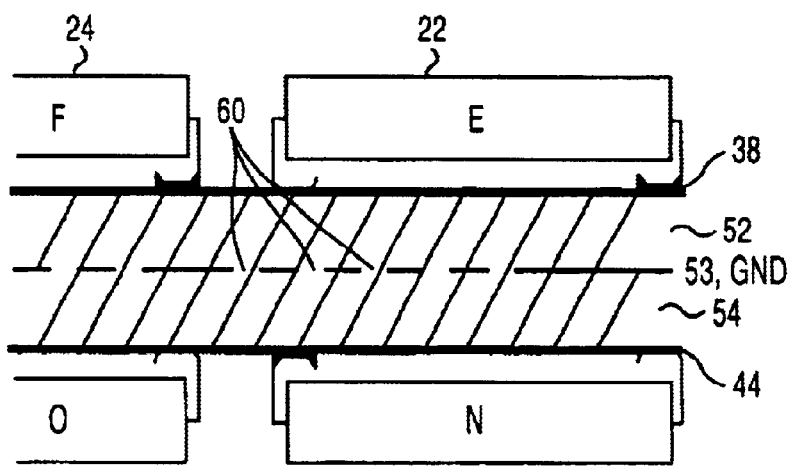
FIG. 11 is a cross-sectional view of a motherboard according to a second embodiment.
Figure 12:
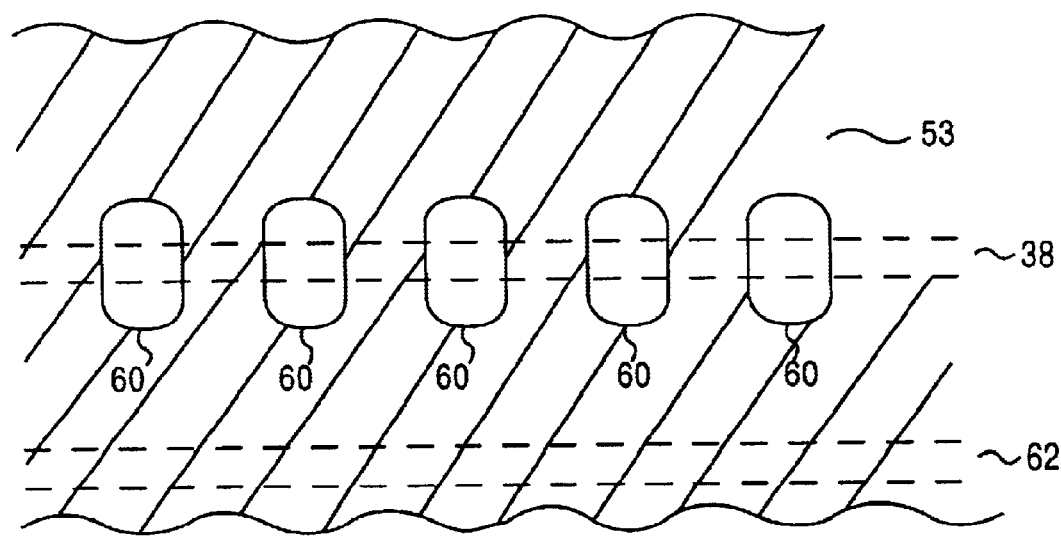
FIG. 12 is a partial plan view of the motherboard according to the second embodiment.

FIG. 11 is a cross-sectional view of the motherboard 10 according to the second embodiment in FIG. 9, and FIG. 12 is a partial plan view of the motherboard 10. As is apparent from FIGS. 11 and 12, in the second embodiment, the slit shaped areas of the ground wiring layer 53 on the motherboard 10, which correspond to the short branched signal lines 38 and 44, are removed. Portions 60 in FIG. 12 correspond to those areas. With this structure, the thickness of the insulating layer 52 deposited between the shorter branched signal line 38 and the ground wiring layer 53 is substantially increased. Of the strip line structure it is well known that when the thickness of an insulating film (or a dielectric film) is increased, generally its inductance $L_0$ is increased, and accordingly the signal capacitance $C_0$ is reduced.

Therefore, as is apparent from equation (1), the increase in the inductance $L_0$ at the shorter branched signal line causes an increase in the signal transmission time. Since the signal capacitance $C_0$ is smaller than the terminal capacitance Cd as in the first embodiment, the increase in the inductance $L_0$ induces an increase in the signal transmission time Td1, even though the signal capacitance $C_0$ is reduced because of the slit like structures 60 in the ground wiring layer 53. As a result, the signal transmission time Td1 for the shorter branched signal lines 38 and 42 is increased. And when an appropriate slit structure is selected, the periods required for signal transmission along the four signal lines which branch at the branch node N3 are substantially the same, and the occurrence of ringing due to the interference produced by reflected waves can be prevented.

Figure 13:
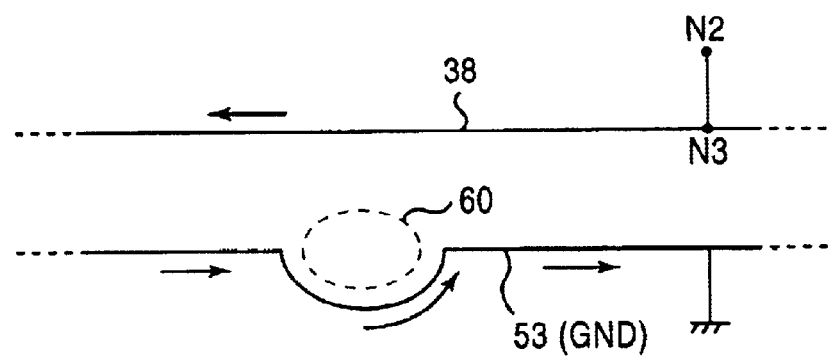
FIG. 13 is a conceptual diagram of delayed signal transmission when one part of a ground wiring layer is removed.

FIG. 13 is a conceptual diagram showing delayed signal transmission when the ground wiring layer 53 is partially removed. In the general strip structure, a signal transmitted along the branched signal line 38 returns along the opposite ground wiring layer 53. In this case, if the ground wiring layer 53 is partially removed (the area 60), as is shown in FIGS. 9 and 12, a bypass for the return is required at the area 60. It is, therefore, understood that the signal transmission is delayed by partially removing the ground wiring layer 53.

Third Embodiment

In a third embodiment, as is shown in FIG. 1, the widths of the individual branched signal lines are the same, and a ground wiring layer on a motherboard does not have a special slit structure. It should be noted that shorter branched signal lines 38 and 42 are formed of conductive thin films, for example, of copper, and in addition, a plated layer of a ferromagnetic material, such as nickel, is formed. Then, the shorter branched signal lines 38 and 42 are ferromagnetic, and their inductances $L_0$ can be increased. As a result, the signal transmission time Td1 for the shorter branched signal lines produced by the unit length is longer than that for the longer branched signal lines, and the periods required for signal transmission from the branch node N3 to the respective distal ends of the branched signal lines are approximately the same.

Fourth Embodiment

In the first to the third embodiments, a structure has been employed in which the branched signal lines 38 and 44 are open at their distal ends. Therefore, in each embodiment an arrangement is employed for preventing the occurrence of an interruption between reflected signals at the distal end. In a fourth embodiment, a signal line loop is employed wherein the distal ends of branched signal lines are connected on the obverse face and the reverse face of the motherboard. With such a signal line loop, the problem related to the reflected signals at the distal ends need not be considered. It should be noted, however, that the periods required for signal transmission along two signal line loop segments originating at the branch node N3 must be equal in order to prevent signals returned along the signal loop segments from interfering with each other at the branch node N3. In other words, with the same structure and made of the same material, the lengths of the two signal loop segments must be the same.

Figure 14:
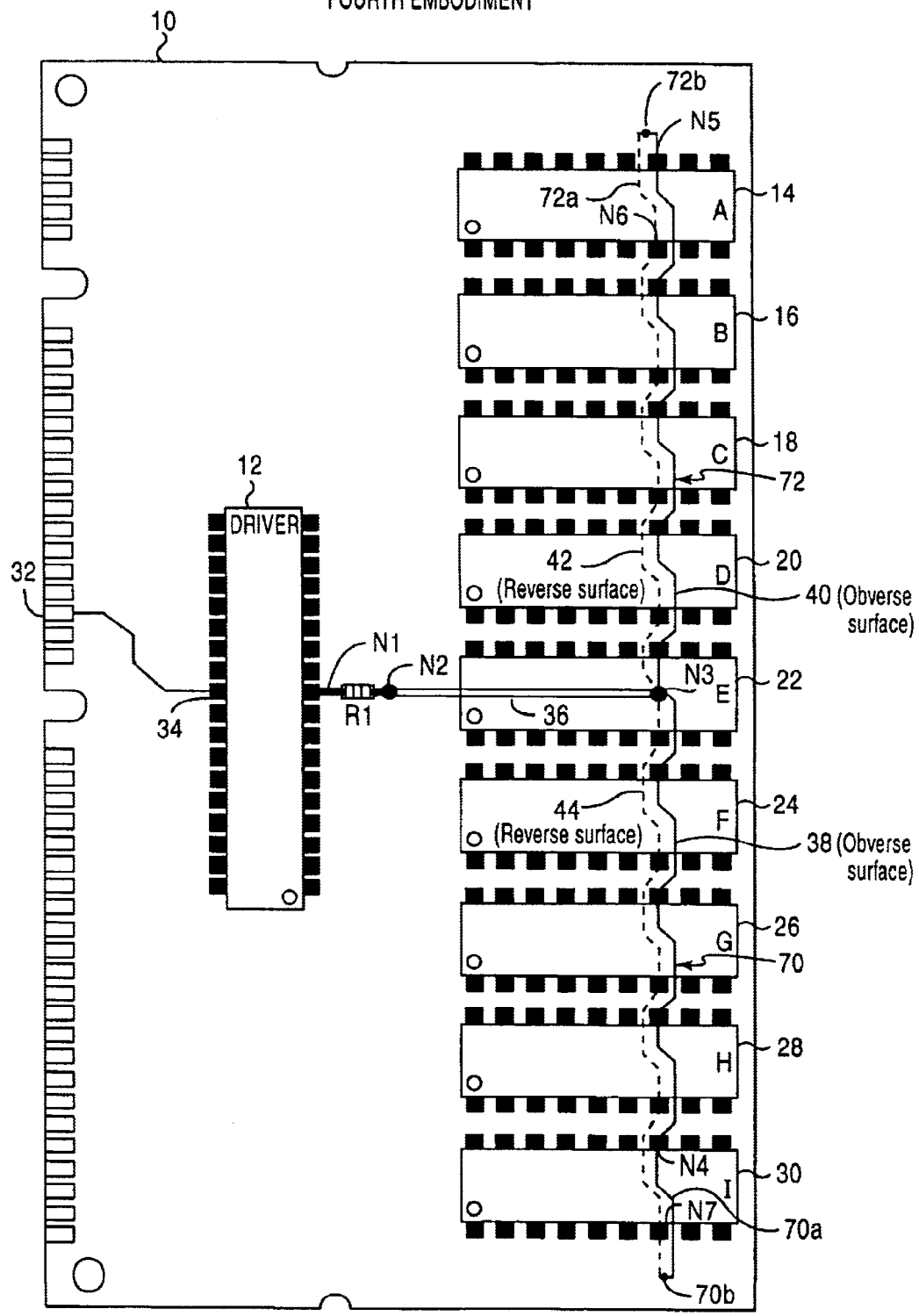
FIG. 14 is a plan view of a motherboard according to a fourth embodiment.

FIG. 14 is a plan view of a motherboard according to a fourth embodiment of the present invention. The same reference numerals as are used in FIGS. 4 and 9 are used to denote corresponding components. In the fourth embodiment, a branched signal line 38 which extends downward from a branch node N3 across the obverse face of a motherboard 10 is connected at its distal end to a branched signal line 44 which extends downward from the branch node N3 across the reverse face. That is, a wiring line 70a and a through hole 70b are additionally formed to connect the nodes N4 and N7, and together they provide a first signal line loop 70 with the branched signal lines 38 and 44.

Similarly, a branched signal line 40 which extends upward from the branch node N3 across the obverse face of the motherboard 10 is connected at the distal end N5 to a branched signal line 42 which extends upward from the branch node N3 across the reverse face. That is, a wiring line 72a and a through hole 72b are additionally formed to connect the nodes N5 and N6, and together they provide a second signal line loop 72 with the branched signal lines 40 and 42. The signal line loops 70 and 72 to the branch node N3 are symmetrical and have the same length.

Figure 15:
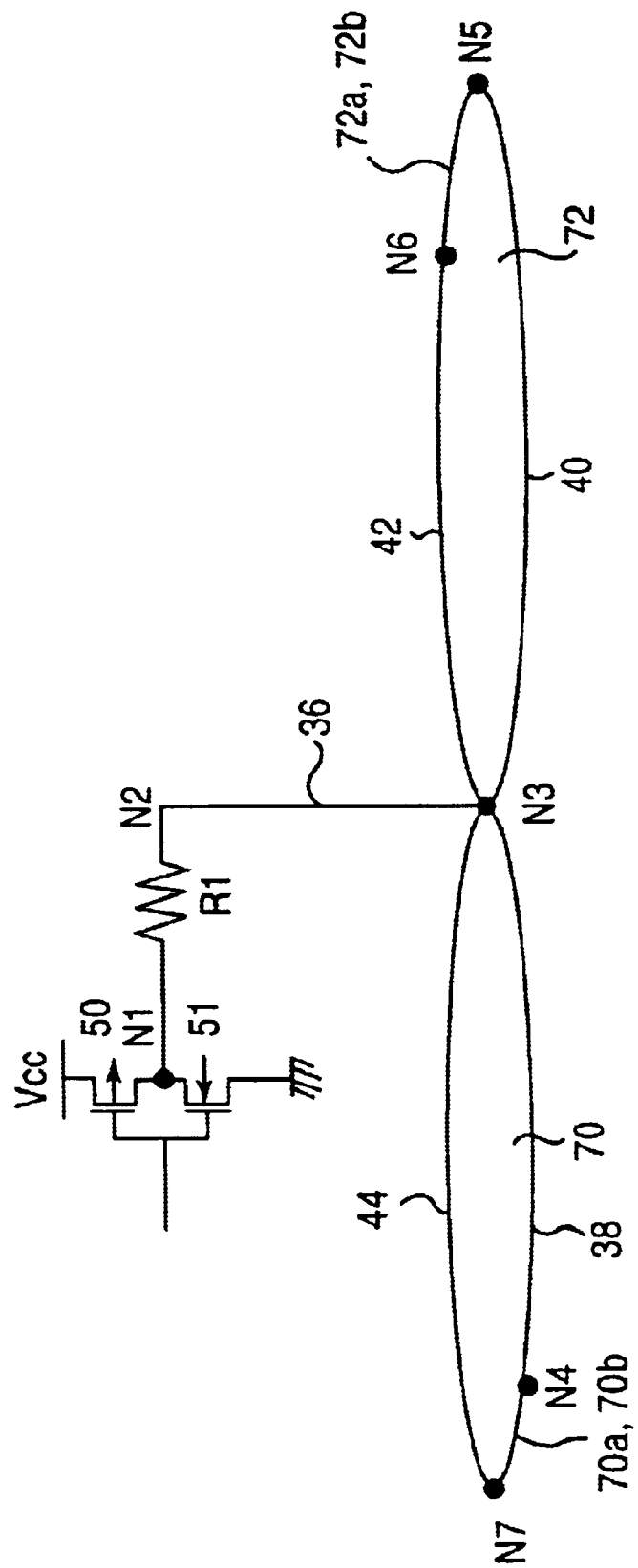
FIG. 15 is an equivalent circuit diagram for signal lines in FIG. 14.

FIG. 15 is an equivalent circuit diagram for the signal lines in FIG. 14. The same reference numerals as used in FIG. 5 are used to denote corresponding components. As is shown in FIG. 15, on the left side of the branch node N3, the first signal loop 70 is formed using the branched signal line 38, the additionally provided signal line 70a and the through hole 70b, and the branched signal line 44. Likewise, on the right side of the branch node N3, the second signal loop 72 is formed using the branched signal line 40, the additionally provided signal line 72a and the through hole 72b, and the branched signal line 42. The signal line loops 70 and 72 have the same characteristic impedance and the same length.

Therefore, a signal supplied to the branch node N3 is branched, and the branched signals are transmitted clockwise and counterclockwise respectively along the signal line loops 70 and 72, pass through the nodes N4 to N7, and return to the branch node N3. In other words, the reflected waves do not occur at the distal ends. Since the periods required for signal transmission are equal, the signals returned along the loops do not interfere with each other at the node N3. As a result, the occurrence of vibration at the nodes N4 to N7 due to ringing can be prevented.

As is described above, according to the present invention, in a module wherein a plurality of integrated circuit devices are mounted in parallel on a motherboard, the same time period is provided which is required for signal transmission from a branching point to the distal end of each of the signal lines along which a signal is supplied in common to individual integrated circuit devices. Therefore, signals reflected at the distal ends do not interfere with each other, and vibration of a signal due to ringing can be prevented.

Further, according to the present invention, in a module wherein a plurality of integrated circuit devices are mounted in parallel on a motherboard, a plurality of branched signal lines, along which a signal is supplied in common to the individual integrated circuit devices, are so provided that an inductance produced by the unit length of a branched signal line having a longer distance from the branch point to its distal end is smaller than that for a shorter branched signal line. Therefore, the signal transmission times for the two branched signal lines can be the same, and the occurrence of ringing due to interference produced by the reflected waves having shifted phases can be prevented.

In addition, according to the present invention, in a module wherein a plurality of integrated circuit devices are mounted in parallel on a motherboard, a plurality of branched signal lines along which a signal is supplied in common to the individual integrated circuit devices are connected together at their distal ends to form a signal loop structure. As a result, the reflection of signals does not occur at the distal ends, and since the interference produced by signals returning through the loops is removed by forming the signal line loops which have the same length, the vibration of signals caused by ringing can be prevented.

What is claimed is:

1. An integrated circuit device module, in which a plurality of groups of integrated circuit devices are mounted on a motherboard, comprising:

a plurality of branched signal lines, formed on said motherboard and extending from a common branch node to individual distal ends, along which a common signal is supplied to said groups of integrated circuit devices respectively, wherein each of said plurality of branched signal lines comprises a first branched signal line having a first length from said branch node to the distal end, and a second branched signal line having a second length from said branch node to the distal end which is shorter than said first length, and an inductance generated by the unit length of said first branched signal line is smaller than an inductance generated by the unit length of said second branched signal line.

2. An integrated circuit device module according to claim 1, wherein said first branched signal line is wider than said second branched signal line.

3. An integrated circuit device module according to claim 1, wherein said motherboard has a power wiring layer formed through an insulating film at a position opposite said branched signal lines, and an area of said power wiring layer opposite said first branched signal line is greater, by the unit length, than that opposite said second branched signal line.

4. An integrated circuit device module according to claim 1, wherein said motherboard has a power wiring layer formed through an insulating film at a position opposite said branched signal lines, and an area of said power wiring layer opposite to said second branched signal line is removed.

5. An integrated circuit device module according to claim 1, wherein at least one part of said second branched signal line is formed of a material containing nickel or another ferromagnetic material.

6. An integrated circuit device module according to one of claims 1 to 5, wherein a drive device for outputting said common signal is mounted on said motherboard, and said drive device outputs said common signal to said common node.

7. An integrated circuit device module, in which a plurality of integrated circuit devices are mounted on a motherboard, comprising:

first and second branched signal lines, formed on said motherboard and each extending from a common branch node to a distal end, through which a common signal is supplied to said integrated circuit devices respectively, wherein said first branched signal line having a first length from said common branch node to its distal end, and said second branched signal line having a second length from said common branch node to its distal end which is shorter than said first length, and an inductance per unit length of said first branched signal line is smaller than that of said second branched signal line.

* * * * *